United States Patent [19]
Kudo

[11] Patent Number: 5,496,768
[45] Date of Patent: Mar. 5, 1996

[54] METHOD OF MANUFACTURING POLYCRYSTALLINE SILICON THIN FILM

[75] Inventor: Toshio Kudo, Tokyo, Japan

[73] Assignee: Casio Computer Co., Ltd., Tokyo, Japan

[21] Appl. No.: 344,502

[22] Filed: Nov. 23, 1994

[30] Foreign Application Priority Data

Dec. 3, 1993 [JP] Japan ................................ 5-338960
Jun. 27, 1994 [JP] Japan ................................ 6-165778

[51] Int. Cl.⁶ .......................... H01L 21/268; C30B 1/00
[52] U.S. Cl. ................. 437/174; 437/233; 148/DIG. 93; 148/DIG. 90; 117/8; 117/904
[58] Field of Search ..................... 117/44, 904, 8, 117/10; 437/173, 174, 233, 40 TFT, 40 TFI, 41 TFT, 41 TFI; 148/DIG. 93, DIG. 90

[56] References Cited

U.S. PATENT DOCUMENTS

| | | | |
|---|---|---|---|
| 4,234,358 | 11/1980 | Celler et al. | 117/904 |
| 5,145,808 | 9/1992 | Sameshima et al. | 437/173 |
| 5,308,998 | 5/1994 | Yamazaki et al. | 257/57 |
| 5,313,076 | 5/1994 | Yamazaki et al. | 257/66 |
| 5,338,388 | 8/1994 | Sugahara et al. | 117/44 |
| 5,365,875 | 11/1994 | Asai et al. | 117/7 |

FOREIGN PATENT DOCUMENTS

| | | | |
|---|---|---|---|
| 55-67132 | 5/1980 | Japan . | |
| 57-45921 | 3/1982 | Japan | 117/904 |
| 58-116720 | 7/1983 | Japan | 437/174 |
| 58-162032 | 9/1983 | Japan | 437/174 |
| 58-201326 | 11/1983 | Japan . | |
| 58-222521 | 12/1983 | Japan | 437/174 |
| 61-187223 | 8/1986 | Japan . | |
| 1-25515 | 1/1989 | Japan . | |

OTHER PUBLICATIONS

T. T. D'Ouville et al., J. Appl. Phys., 53, 7 (1982) 5086 ". . . Laser Annealed Polycrystalline Silicon Films".

Primary Examiner—Brian E. Hearn
Assistant Examiner—Leon Radomsky
Attorney, Agent, or Firm—Frishauf, Holtz, Goodman, Langer & Chick

[57] ABSTRACT

In the first laser beam radiation, a laser beam having a predetermined energy density is scanned on each of predetermined unit irradiated regions at a scanning pitch smaller than the beam size, and in the second laser beam radiation, a laser beam having an energy density lower than that of the laser beam of the first radiation is scanned at a scanning pitch smaller than the beam size on each of unit irradiated regions different from those of the first laser beam radiation.

17 Claims, 5 Drawing Sheets

METHOD OF MANUFACTURING POLYCRYSTALLINE SILICON THIN FILM

BACKGROUND OF THE INVENTION

1. Field of the Invention

The present invention relates to a method of manufacturing a polycrystalline silicon thin film.

2. Description of the Related Art

Conventionally, for manufacturing, for example, a thin film transistor by converting an amorphous silicon thin film into a polycrystalline silicon thin film, there is proposed a method in which an amorphous silicon thin film is formed on an entire surface of an insulating substrate such as a glass substrate having relatively a large size, an eximer laser beam is radiated on the amorphous silicon thin film so as to convert the amorphous silicon thin film into a polycrystalline silicon thin film, and the polycrystalline silicon thin film is separated into elements, thus manufacturing a number of thin film transistors. In this method, the eximer laser beam is scanned in order to radiate the beam on the entire amorphous silicon thin film on the insulating substrate, since the beam size of the eximer laser beam is as small as about 10 mm square at maximum, as compared with the size of the insulating substrate.

In the above-described conventional method of manufacturing a polycrystalline silicon thin film, the radiation of beams must be overlaped in the boundary sections between regions irradiated with a laser beam, which are adjacent to each other in both horizontal and vertical directions so as to irradiate the entire amorphous silicon thin film on the insulating substrate. However, since the eximer laser beam radiated has a high energy density, crystal grains fuse with each other in the regions where the radiation of the beams overlaps. As a result, the sizes of crystal grains of the polycrystalline silicon thin film vary with each other, and the irregularity of the surface of the polycrystalline silicon thin film increases. Consequently, the characteristics of the thin film transistor such as mobility, ON-voltage and leak current vary significantly from one transistor to another. Thus, such a technique is not suitable for mass production.

SUMMARY OF THE INVENTION

An object of the present invention is to provide a method of manufacturing a polycrystalline silicon thin film, capable of making the sizes of crystal grains of the polycrystalline silicon thin film uniform, and reducing the irregularity of the surface of the polycrystalline silicon thin film.

In order to achieve the above-described object, there is provided, according to the present invention, a method of manufacturing a polycrystalline silicon thin film, in which a scanning laser beam is scanned on an amorphous silicon thin film a plurality of times so as to convert the amorphous silicon thin film into a polycrystalline silicon thin film, comprising: a first laser radiation step for scanning to radiate a laser beam having a predetermined energy density for each of predetermined regions; and one or more steps of laser radiation from a second time onward, for scanning to radiate a laser beam having an energy density lower than that of the first laser radiation on the amorphous silicon thin film on which the first laser beam radiation was carried out, for each of predetermined regions different from the regions of the first laser beam radiation.

According to the above-described method of manufacturing a polycrystalline silicon thin film, a region which absorbs excessive energy is not created. Therefore, the growth of silicon crystal grain is promoted without melting the polycrystalline silicon thin film which has been converted by the preceding laser beam radiation, and the distortion of the polycrystalline silicon thin film, caused by quick cooling can be eased. Consequently, the crystal grain size of the polycrystalline silicon thin film can be made uniform, and the irregularity of the surface of the thin film can be suppressed.

In the above-described polycrystalline silicon thin film manufacturing method, the scanning pitch of laser radiation in each laser radiation step should preferably be smaller than the beam size of the laser beam. Or, in the first laser beam radiation step, the laser radiation may be carried out with the same scanning pitch as the beam size of the laser beam; however, in laser beam radiation steps from the second time onward, the scanning pitch should preferably be smaller than the beam size, but should preferably be equal to ⅓ of the beam size or larger.

In the above polycrystalline silicon thin film manufacturing method, the energy density of the laser beam used in the first laser radiation step should preferably be 390–520 mJ/cm$^2$. In this case, the energy density of the laser beam used in the laser radiation steps from the second time onward should be 180–350 mJ/cm$^2$, preferably, 240–300 mJ/cm$^2$, more preferably, about 275 mJ/cm$^2$.

In the above polycrystalline silicon thin film manufacturing method, the energy density of each laser beam used in the laser radiation steps from the third time onward should preferably be equal to or less than that of the immediately preceding time.

In order to achieve the above-described object, there is also provided, according to the present invention, a method of manufacturing a polycrystalline silicon thin film, in which a scanning laser beam is radiated on an amorphous silicon thin film a plurality of times, so as to convert the amorphous silicon thin film into a polycrystalline silicon thin film, comprising: a first laser radiation step for scanning to radiate a laser beam on each of predetermined regions at substantially the same scanning pitch as the beam size of the laser beam; and steps of laser radiation from a second time onward, for scanning to radiate a laser beam having the same beam size as that of the first laser radiation at a scanning pitch smaller than the beam size of the first laser radiation, on the amorphous silicon thin film on which the first laser radiation was carried out, for each of predetermined regions different from the regions of the first laser radiation.

With regard to the above-described polycrystalline silicon thin film manufacturing method, it is preferable that, in the laser radiation steps from the second time onward, the scanning pitch should be smaller than the beam size, but should be equal to ⅓ of the beam size or larger.

In order to achieve the above-described object, there is also provided, according to the present invention, a method of manufacturing a polycrystalline silicon thin film, in which a scanning laser beam is radiated on an amorphous silicon thin film a plurality of times, so as to convert the amorphous silicon thin film into a polycrystalline silicon thin film, comprising: a first laser radiation step for scanning to radiate a laser beam on each of predetermined regions at a scanning pitch smaller than the beam size of the laser beam; and steps of laser radiation from a second time onward, for scanning to radiate a laser beam on the amorphous silicon thin film, on which the first laser radiation was carried out at a scanning pitch smaller than the beam size of the beam in each laser beam radiation step laser radiation, for each of predetermined regions different from the regions of the previous laser radiation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
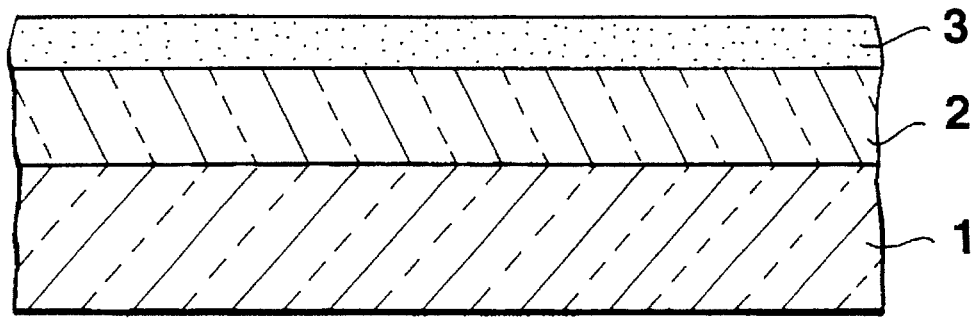
FIG. 1 is a cross section of an amorphous silicon thin film formed on an underlayer formed on a glass substrate, by the method according to the first embodiment of the present invention.

A method of manufacturing a polycrystalline silicon thin film, according to the first embodiment of the present invention, will now be described with reference to FIGS. 1 to 3B. First, as shown in FIG. 1, an underlayer 2 having a thickness of about 1000 Å and made of silicon oxide is formed on the top surface of a relatively large glass substrate 1 having a thickness of 1.1 mm and an area of 320×340 mm by using a magnetron spattering apparatus. Then, an amorphous silicon hydride thin film 3 having a thickness of 500 Å is formed on the upper surface of the underlayer 2 by a PECVD apparatus. Next, a dehydrogenating treatment is carried out in a nitrogen gas atmosphere at a temperature of about 450° C. for about 1 hour, so as to avoid the occurrence of defects due to the bumping of hydrogen which high energy is applied by the radiation of an eximer laser beam in a later step.

Figure 2:
FIG. 2 is a cross section of the amorphous silicon thin film shown in FIG. 1, which is to be transformed into a polycrystalline silicon thin film by scanning an eximer laser beam thereon.
Figure 2:
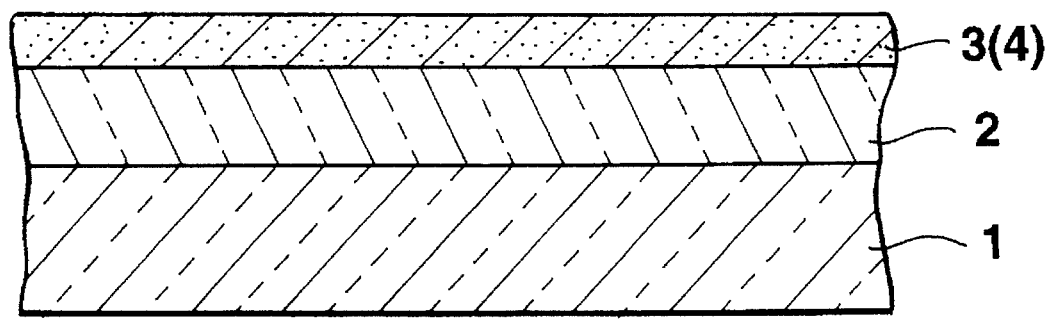
Figure 3A:
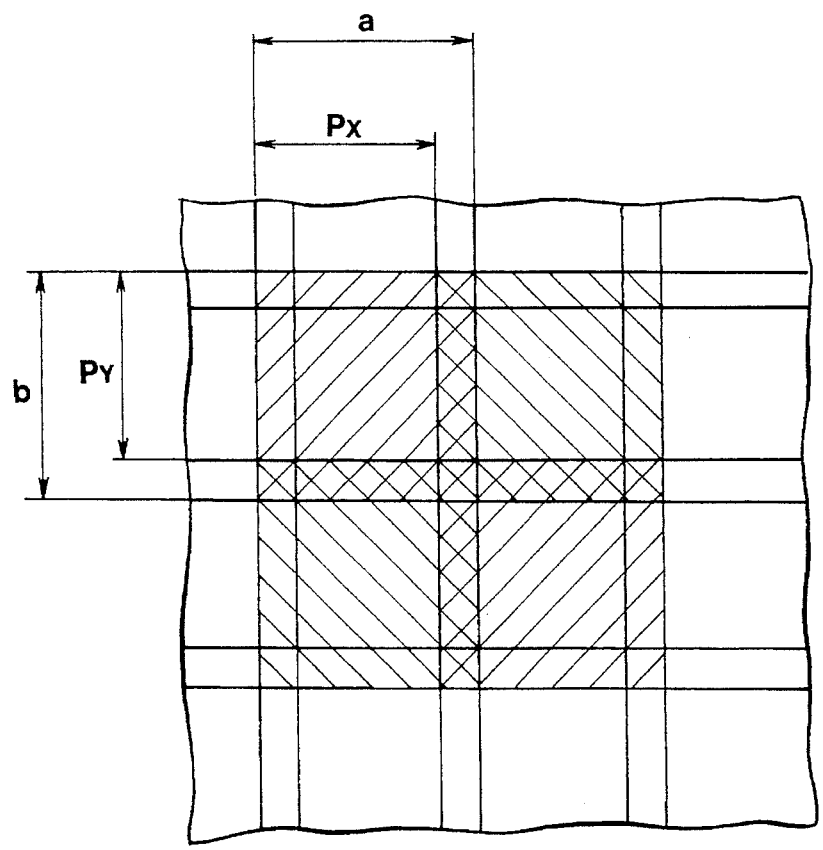
FIG. 3A is a plan view illustrating the first laser beam scan radiation in the first embodiment of the present invention.
Figure 3B:
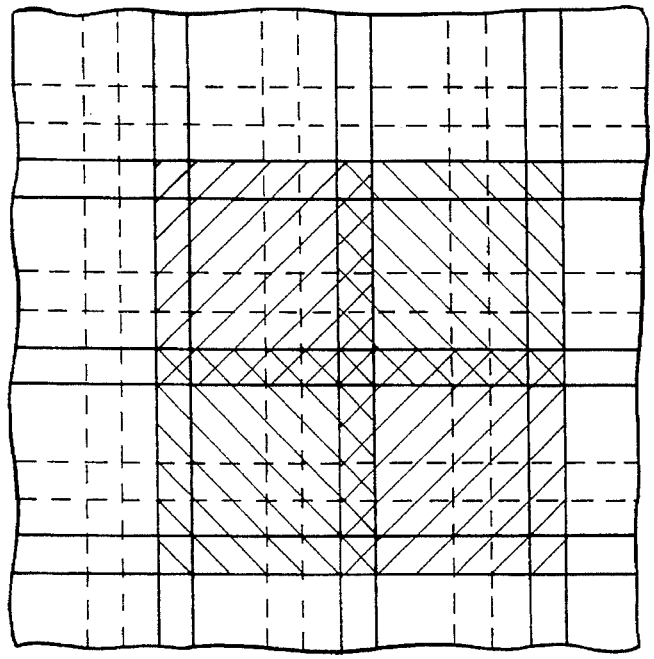
FIG. 3B is a plan view illustrating the second laser beam radiation in the first embodiment.

Next, as shown in FIG. 2, an eximer laser beam is radiated on the amorphous silicon thin film 3 which has been subjected to the dehydrogenating treatment, in a vacuum heat treatment furnace, thereby converting the amorphous silicon thin film 3 into a polycrystalline silicon thin film 4. In this case, a pulsated eximer laser beam of 7.2–9.3 mm square is scanned every predetermined time (1 shot) intermittently at a scanning pitch which is somewhat smaller than the beam size. Further, as indicated by hatching in FIG. 3A, the boundary portions of laser beam irradiated regions adjacent to each other in both horizontal and vertical directions are repetitively irradiated with the beam. In the example shown in FIG. 3A, a laser beam having a beam size of a × b is scanned at a pitch of $P_X$ in the horizontal direction and a pitch of $P_Y$ in the vertical direction. In order to avoid the thin film converting back to the amorphous state due to quick cooling after the melting of the amorphous silicon thin film 3, the energy density is set as high as about 390–520 $mJ/cm^2$.

Then, in the same vacuum heat treatment furnace, an eximer laser beam having a low energy density of 180–350 $mJ/cm^2$ is scanned on the polycrystalline silicon thin film 4. Also, in this case, a pulsated eximer laser beam of 7.2–9.3 mm square is scanned at a scanning pitch which is somewhat smaller than the beam size; however an irradiated region for every 1 shot hereinafter referred to as a unit irradiated region) is made different from the previous unit irradiated region shown in FIG. 3A. More specifically, as indicated by hatching in FIG. 3B, the unit irradiated region of this case is set at a different position from that of the unit irradiated region indicated by chain lines shown in FIG. 3A. The laser beam repetitively irradiated region of this time should be made different as much as possible from that of the immediately preceding time, so as to avoid the creation of an excessive energy absorbing region. The energy density of this time is as low as about 180–350 $mJ/cm^2$, and therefore the growth of fine silicon crystal grains formed by the immediately previous laser beam radiation is promoted without melting the polycrystalline silicon thin film 4 which was converted to that state by the immediately previous laser beam radiation, and the distortion of the polycrystalline silicon thin film 4, caused by quick cooling can be eased. Consequently, the sizes of crystal grains of the polycrystalline silicon thin film 4 can be made uniform, and the irregularity of the surface of the polycrystalline silicon thin film can be reduced.

Figure 4:
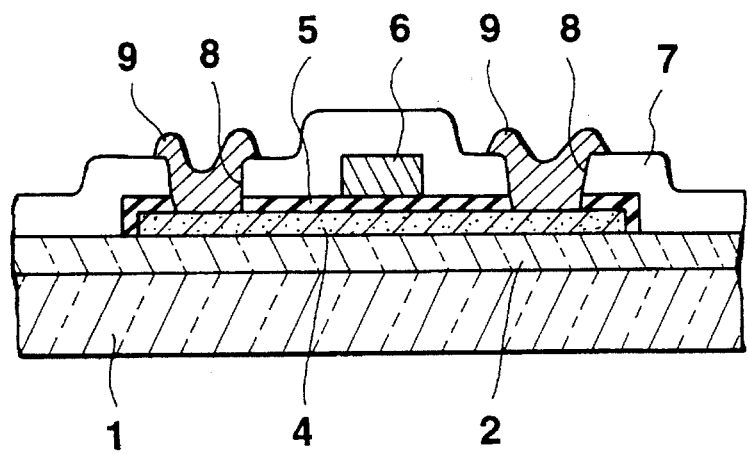
FIG. 4 is a cross section showing an example of the structure of a thin film transistor formed by using the polycrystalline silicon thin film substrate shown in FIG. 2.

Next, an example of the structure of a thin film transistor formed by using the polycrystalline silicon thin film 4 will be described with reference to FIG. 4. First, the polycrystalline silicon thin film 4 is separated into elements as known, and then a gate insulating film 5 and a gate electrode 6 are formed and an impurity is selectively diffused into the polycrystalline silicon thin film 4 using the gate electrode 6 as a mask to form source and drain regions. Thereafter, source and drain electrodes 9 which are respectively connected to the source and drain regions layer via contact holes 8 formed in an interlayer insulating film 7 and, is formed on the interlayer insulating film 7, thus completing a thin film transistor. In this thin film transistor, the characteristics such as the mobility, the ON-voltage and the leak current can be made uniform.

A method of manufacturing a polycrystalline silicon thin film, according to the second embodiment will now be described. The second embodiment differs from the first embodiment only in the eximer laser beam radiation steps. These steps will now be explained. The first eximer laser beam radiation is carried out in the following manner. That is, a pulsated eximer laser beam having a beam size of 7.2–9.3 mm square and a high energy density of about 390–520 mJ/cm$^2$ is scanned intermittently at a scanning pitch equal to the beam size. Therefore, no repetitively irradiated region is created by the first scanning beam radiation. Then, the second eximer laser beam radiation is carried out in the following manner. That is, a pulsated eximer laser beam having a beam size of 7.2–9.3 mm square and a low energy density of about 180–350 mJ/cm$^2$ is scanned intermittently at a scanning pitch smaller than the beam size. Naturally, the unit irradiated regions of the first and second radiation steps differ from each other.

A specific example will be described. In this example, the scanning beam radiation was carried out two times, and the optimal value of the energy density was selected in each scanning radiation step. First, as described above in connection with the first embodiment referring to FIG. 1, an underlayer 2 having a thickness of about 1000 Å and made of silicon oxide was formed on the top surface of a relatively large glass substrate 1 having a thickness of 1.1 mm and an area of 320×340 mm, and an amorphous silicon hydride thin film 3 having a thickness of 500 Å was formed on the upper surface of the underlayer 2. After that, a dehydrogenating treatment was carried out, thus a sample was obtained. In the same manner, a plurality of samples were prepared.

In the first scanning laser beam radiation, a pulsated eximer laser beam having a size of 8.9 mm square was scanned on the samples at a scanning pitch equal to the beam size with various energy densities predetermined within a range of 315–520 mJ/cm$^2$, and the sheet resistances of the samples with respect to each of the various radiation energy density values were measured. The measurement was performed in the following manner. That is, each sample was cut to obtain a sample piece having a size of 20×240 mm, and four probes arranged in series at an interval of 1 mm were disposed so as to lie in the width direction. The tip end of each probe was brought into contact with the surface of a respective sample piece, and was moved within a range of 0–230 mm in the longitudinal direction at a pitch of 10 mm. Thus, the results listed in TABLE 1 were obtained. It should be noted that the conditions for the measurement for the sheet resistance will be the same as the above-described case in the following descriptions.

TABLE 1

| Radiated energy density (mJ/cm$^2$) | Sheet resistance (Ω/□) |
|---|---|
| 315 | (4.49 ± 0.13) × 10$^{11}$ |
| 340 | (3.30 ± 0.14) × 10$^{11}$ |
| 365 | (6.27 ± 0.25) × 10$^{10}$ |
| 390 | (7.07 ± 0.17) × 10$^{10}$ |
| 415 | (6.98 ± 0.12) × 10$^{10}$ |
| 440 | (8.20 ± 0.18) × 10$^{10}$ |
| 465 | (8.04 ± 0.12) × 10$^{10}$ |
| 490 | (7.23 ± 0.15) × 10$^{10}$ |
| 520 | (5.73 ± 0.12) × 10$^{10}$ |

TABLE 1 lists the average values of sheet resistances with respect to respective radiation energy densities, and probable errors thereof. Each of the probable errors was obtained by the following formula:

Probable error = $0.6745 \sqrt{\{E(x_i-x_{av})^2/n(n-1)\}}$ where $x_i$ represents a sheet resistance, $x^{av}$ is the average value of sheet resistances, and n is the number of locations of measurement of sheet resistance.

Figure 5:
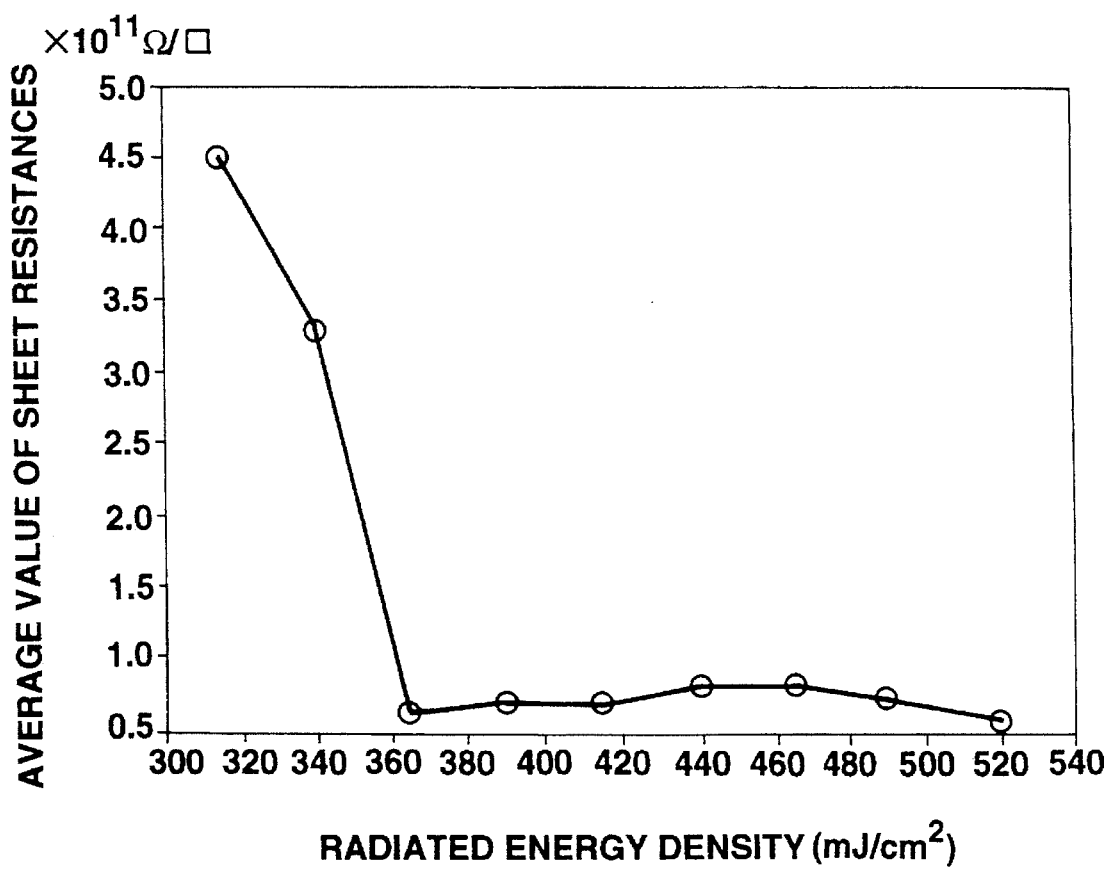
FIG. 5 is a graph showing the average value of the sheet resistance with respect to the energy density in the first laser radiation in a specific example of the present invention.
Figure 6:
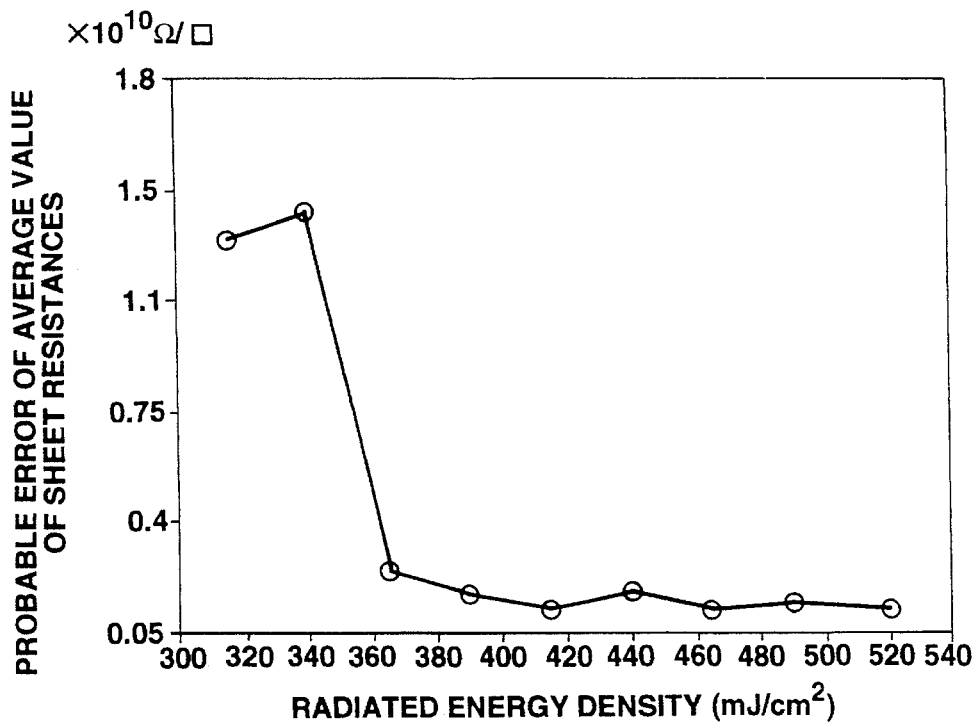
FIG. 6 is a graph showing the probable (probability) error of the average value of the sheet resistance with respect to the energy density in the first laser radiation in a specific example of the present invention.

Of the numeral data shown in TABLE 1, the average values of sheet resistances with regard to the respective radiation energy densities were graphed as shown in FIG. 5, and the probable errors of the average values of the sheet resistances with regard to the respective radiation energy densities were graphed as shown in FIG. 6. As is clear from FIGS. 5 and 6, the average value of the sheet resistance and the probable error drastically decrease near the point of a radiation energy density of 365 mJ/cm$^2$. The degree of the decrement of each of the average values of sheet resistances and the probable error within a radiation energy density region of 390–520 mJ/cm$^2$ were roughly calculated. The average values were reduced to 1/5–1/8 of the maximum value, and the probable errors were reduced to 1/8–1/12 of the maximum value. Further, in consideration of the fact that the average value of the sheet resistances is correlated with the crystal size and the crystallinity and the probable error of the average value of the sheet resistances reflects the uniformity of the film structure, the energy density of the first laser beam radiation should preferably be selected from a range of 390–520 mJ/cm$^2$.

Next, the second scanning beam radiation was carried out on a plurality of samples obtained by the first radiation with an energy density of 340 mJ/cm$^2$, and the dependency of the probable error of the average value of the sheet resistances with respect to the energy density of the second beam radiation was examined. The results were summarized in FIG. 7. The reason for selecting an energy density of 340 mJ/cm$^2$ in the first beam radiation is that the probable error of the average value of the sheet resistances for this energy density is at maximum as can be seen from FIG. 6, and therefore if the influence of the second scanning beam radiation is analyzed with this worst case, most prominent data can be obtained. In the first scanning beam radiation, a pulsated eximer laser beam having a beam size of 8.9 mm square was scanned on samples at a scanning pitch equal to the beam size. In the second scanning beam radiation, a pulsated eximer laser beam having a beam size of 8.7–9.2 mm square was scanned on samples with respective various energy densities preset within a range of 175–340 mJ/cm$^2$ at the same scanning pitch as the beam size. The reason for setting the scanning pitch of the second scanning beam radiation equal to the beam size is simply to examine the dependency of the probable error of the average value of the sheet resistances with respect to the energy density Of the second laser beam radiation. It should be noted that the starting point of the second scanning beam radiation was shifted from that of the first scanning beam radiation by a half of the beam size in the X and Y directions.

Figure 7:
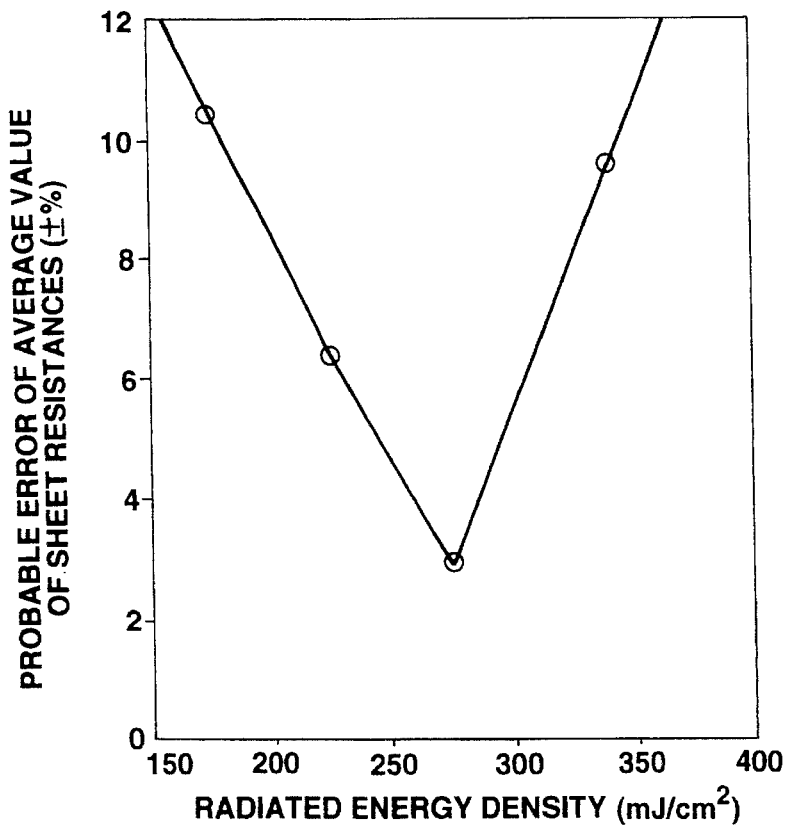
FIG. 7 is a graph showing the probable (probability) error of the average value of the sheet resistance with respect to the energy density in the second laser radiation in a specific example of the present invention.

As is clear from FIG. 7, the probable error of the average value of the sheet resistances is within ±10% when the energy density of the second beam radiation is about 180–350 mJ/cm$^2$. When the energy density is about 240–300 mJ/cm$^2$, the probable error is within ±5% and when the energy density is near 275 mJ/cm$^2$, the probable error becomes minimum, which is about ±2.9%. To summarize, the energy density of the second beam radiation should preferably be about 180–350 mJ/cm$^2$, more preferably about 240–300 mJ/cm$^2$, with near 275 mJ/cm$^2$ being best preferable. The conditions for the energy density in the second beam radiation are the same in the case where the energy density of the first beam radiation is about 390–520 mJ/cm$^2$.

In consideration of the above results, a further experiment was carried out with the selection of an energy density of 520 mJ/cm$^2$ in the first beam radiation and an energy density of 275 mJ/cm$^2$ in the second beam radiation. In this experiment, a pulsated eximer laser beam having a beam size of 7.2 mm square is scanned at a scanning pitch equal to the beam size for the first scanning beam radiation, and a pulsated eximer laser beam having a beam size of 7.2 mm square is scanned at three different scanning pitches, i.e. $P_X = P_Y = 3.6$ mm, 2.4 mm and 1.5 mm. The samples thus obtained will be called the first, second and third samples respectively in the order. Another sample which was obtained by radiating a pulsated eximer laser beam having a beam size of 8.9 mm square and an energy density of 340 mJ/cm² only one time at a scanning pitch of $P_X = P_Y = 4.5$ mm, was prepared as a reference. This sample will be called the reference sample.

The average value of the sheet resistances and the probable error of each of the first, second third and reference samples were measured, and the results were summarized in TABLE 2.

TABLE 2

| Sample | Sheet resistance ($10^{10}$ Ω/□) |
| --- | --- |
| 1st Sample | 6.83 ± 0.07 |
| 2nd Sample | 7.04 ± 0.08 |
| 3rd Sample | 6.53 ± 0.15 |
| Reference Sample | 6.22 ± 0.60 |

Figure 8:
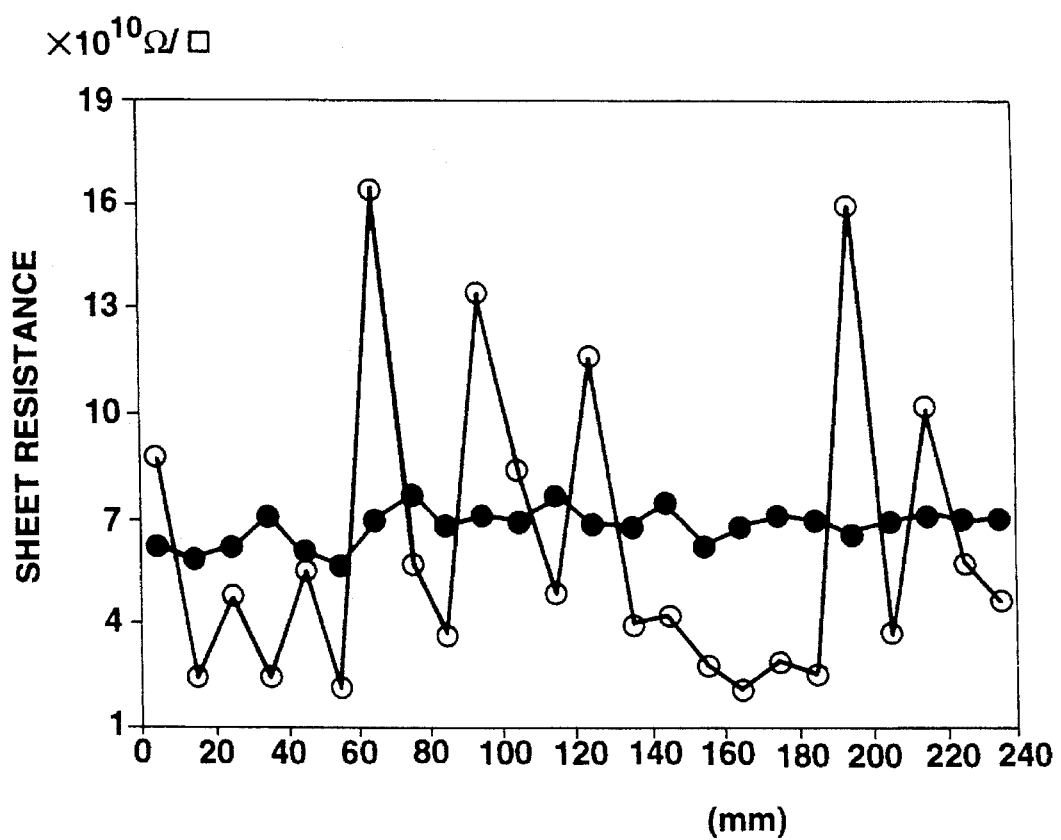
FIG. 8 is a graph showing the distribution of the sheet resistance within each surface of the first sample and reference samples in the specific example of the present invention.

As is clear from TABLE 2, the probable error of the average value of the third sample is as small as ¼ of that of the reference sample, and those of the first and second samples are even smaller, i.e. respectively ⅑ and ⅛ of that of the reference sample. Consequently, the first and second samples, in particular, exhibit an excellent uniformity of the size of crystal grain of the polycrystalline silicon thin film. In this connection, the first sample, which exhibits the best result, and the reference samples were examined in terms of the intrafacial distribution of the sheet resistance, and the results were as shown in FIG. 8. In FIG. 8, the curve indicated by black dots represents the intrafacial distribution of the first sample, whereas the curve indicated by white dots represents that of the reference sample. As is clear from FIG. 8, in the first sample, the uniformity of the sizes of the crystal grains of the polycrystalline silicon thin film is improved about 9 times as much as that of the reference sample (judging from the value of the probable error shown in TABLE 2). Therefore, it can be concluded that the uniformity of the second sample is improved about 8 times as much as that of the reference sample, and that of the third sample is improved about 4 times as much as that of the reference sample. Thus, in the cases of the first and second samples, the uniformity is improved much more than that of the third sample, and therefore the scanning pitch of the second scanning beam radiation should not be only smaller than the beam size, but should preferably be equal to or larger than ⅓ of the beam size.

Next, the first, third and reference samples were examined in terms of roughness of the film surface in an area of 2 μm square at the center portion of each sample by means of an AFM (atomic force microscope), and the results were summarized in TABLE 3.

TABLE 3

| Sample | Roughness of film surface (nm) | Uniformity of film surface structure |
| --- | --- | --- |
| 1st Sample | 2.85 ± 0.05 | ⊙ |
| 3rd Sample | 3.74 ± 0.08 | ⊙ |
| Reference Sample | 7.90 ± 0.43 | △ |

As is clear from TABLE 3, the roughness of the film surface of each of the first and third samples was half or less than that of the reference sample, and also the uniformity of the film surface structure of each of the first and second samples is improved significantly as compared to that of the reference sample. Although the second sample was not actually examined, it can be anticipated that the second sample exhibits a result of an intermediate value between those of the first and third samples.

As described, when the first scanning beam radiation is carried out with an energy density of about 390–520 mJ/cm² and at a scanning pitch equal to the beam size of the laser beam, and the second scanning beam radiation is carried out with an energy density of about 180–350 mJ/cm² and at a scanning pitch smaller than the beam size of the laser beam, the size of crystal grain of the polycrystalline silicon thin film can be made uniform, and the irregularity of the surface of the polycrystalline silicon thin film can be reduced. In this case, the scanning pitch of the second scanning beam radiation should preferably be set smaller than the beam size of the laser beam but equal to or larger than ⅓ of the beam size. Further, the energy density of the second scanning beam radiation should preferably be about 240–300 mJ/cm², or more preferably about 275 mJ/cm².

The number of times of the scanning beam radiation is not limited to two, but the radiation may be performed as many times as desired. In this case, the unit irradiated region of the scanning steps from the third times onward may be the same as or different from that of the second scanning beam radiation, and so may be the energy density. However, it is preferable that the energy density of the third scanning beam radiation onward should be smaller than that of the first scanning beam radiation, and the energy density of a scanning beam radiation step should be the same as or smaller than that of the immediately preceding radiation step.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a polycrystalline silicon thin film, in which a scanning laser beam is irradiated on an amorphous silicon thin film a plurality of times so as to convert the amorphous silicon thin film into a polycrystalline silicon thin film, comprising:

a first laser beam radiation step comprising irradiating a first scanning laser beam on a plurality of first unit regions on the amorphous silicon thin film at a pitch which is not greater than a width in a scanning direction of an area defined by the beam size of the first scanning laser beam; and at least one second step of laser beam radiation comprising irradiating a second scanning laser beam having an energy density lower than that of the first scanning laser beam, on a plurality of second unit regions on the previously scanned amorphous silicon thin film on which the first laser beam radiation step was carried out, at a pitch which is not greater than a width in a scanning direction of an area defined by the beam size of the second scanning laser beam, each of said second unit regions being shifted from the respective first unit regions irradiated and scanned in the first laser beam radiation step, so that at least a part of each of the second unit regions irradiated and scanned in the at least one second step overlaps a part of corresponding first unit regions irradiated and scanned in the first laser beam radiation step.

2. A method of manufacturing a polycrystalline silicon thin film according to claim 1, wherein each of the first laser beam radiation step and the at least one second laser beam radiation step is carried out at a scanning pitch having a width which is smaller than an area defined by a beam size of the laser beam in each laser beam radiation step.

3. A method of manufacturing a polycrystalline silicon thin film according to claim 1, wherein the first scanning laser beam radiation step is carried out at a scanning pitch having a width which is equal to an area defined by a beam size of the first scanning laser beam.

4. A method of manufacturing a polycrystalline silicon thin film according to claim 3, wherein the at least one second step of laser beam radiation is carried out at a scanning pitch having a width which is smaller than an area defined by a beam size of each scanning laser beam from the second scanning laser beam radiation step onward.

5. A method of manufacturing a polycrystalline silicon thin film according to claim 3, wherein the at least one second step of laser beam radiation is carried out at a scanning pitch which has a width in the scanning direction which is smaller than a beam size of each laser beam but equal to or larger than ⅓ of an area defined by the beam size in the at least one second step of laser beam radiation.

6. A method of manufacturing a polycrystalline silicon thin film according to claim 1, wherein an energy density of the laser beam in the first laser beam radiation step is about 390–520 mJ/cm$^2$.

7. A method of manufacturing a polycrystalline silicon thin film according to claim 6, wherein an energy density of each laser beam from the second laser beam radiation step onward is about 180–350 mJ/cm$^2$.

8. A method of manufacturing a polycrystalline silicon thin film according to claim 6, wherein an energy density of the laser beam from the second laser beam radiation step onward is about 240–300 mJ/cm$^2$.

9. A method of manufacturing a polycrystalline silicon thin film according to claim 6, wherein an energy density of the laser beam from the second laser beam radiation step onward is about 275 mJ/cm$^2$.

10. A method of manufacturing a polycrystalline silicon thin film according to claim 1, wherein an energy density of each laser beam from a third laser beam radiation step onward is the same as or lower than that of the immediately preceding step.

11. A method of manufacturing a polycrystalline silicon thin film according to claim 1, further comprising before the first laser beam radiation step:

a step of forming an amorphous silicon hydride thin film on a substrate; and a dehydrogenating step of exposing the amorphous silicon hydride thin film in a high-temperature atmosphere.

12. A method of manufacturing a polycrystalline silicon thin film according to claim 11, wherein the high-temperature atmosphere contains a nitrogen gas.

13. A method of manufacturing a polycrystalline silicon thin film according to claim 12, wherein in the dehydrogenating step, the amorphous silicon hydride thin film is maintained in a nitrogen gas atmosphere of approximately 450° C. for about one hour.

14. A method for manufacturing a polycrystalline silicon thin film according to claim 1, wherein the first scanning laser beam has a beam size which defines an area of 7.2 to 9.3 mm$^2$.

15. A method of manufacturing a polycrystalline silicon thin film, in which a scanning laser beam is irradiated on an amorphous silicon thin film a plurality of times, so as to convert the amorphous silicon thin film into a polycrystalline silicon thin film, comprising:

a first laser beam radiation step comprising irradiating a scanning laser beam on a plurality of unit regions at substantially the same scanning pitch width as an area defined by the beam size of the first scanning laser beam; and a plurality of steps of laser beam radiation from a second step onward comprising for each of said plurality of steps of laser beam radiation irradiating a second scanning laser beam having the same beam size as that of the first scanning laser beam at a scanning pitch which has a width which is smaller than an area defined by the beam size of the first scanning laser beam, on the amorphous silicon thin film on which the first laser beam radiation step was carried out.

16. A method of manufacturing a polycrystalline silicon thin film, according to claim 15, wherein each of the plurality of steps of laser beam radiation is carried out at a scanning pitch which has a width in the scanning direction which is smaller than the beam size of the laser beam but equal to or larger than ⅓ of an area defined by the second scanning laser beam size.

17. A method of manufacturing a polycrystalline silicon thin film, in which a scanning laser beam is irradiated on an amorphous silicon thin film a plurality of times, so as to convert the amorphous silicon thin film into a polycrystalline silicon thin film, comprising:

a first laser beam radiation step comprising irradiating a scanning laser beam on a plurality of first unit regions at a scanning pitch which has a width in a scanning direction which is smaller than an area defined by the beam size of the first scanning laser beam; and a plurality of steps of laser beam radiation from a second step onward comprising for each of said plurality of steps of laser beam radiation irradiating a second scanning laser beam on a plurality of second unit regions on the amorphous silicon thin film on which the first laser beam radiation step was carried out, at a scanning pitch which has a width which is smaller than an area defined by a beam size of the laser beam in each of said plurality of steps of laser beam radiation, each of said second unit regions being shifted from the regions of the previous laser beam radiation, so that at least a part of said each of the second unit regions in each of said plurality of steps of laser beam radiation overlaps a part of corresponding first unit regions irradiated and scanned in the first laser beam radiation step.

\* \* \* \* \*